United States Patent [19]

Blake

[11] Patent Number: 4,758,767

[45] Date of Patent: Jul. 19, 1988

[54] SELF-CONTAINED ANALOG PHOTODIODE LIGHT SENSING HEAD

[75] Inventor: Frederick H. Blake, Mill Creek, Wash.

[73] Assignee: Multipoint Control Systems, Incorporated, Mill Creek, Wash.

[21] Appl. No.: 50,943

[22] Filed: May 15, 1987

[51] Int. Cl.⁴ ............................................. H01J 41/26
[52] U.S. Cl. .................................... 315/158; 315/159; 315/156; 315/311; 250/214 AL; 250/214 AG
[58] Field of Search ............... 315/134, 150, 158, 156, 315/155, 157, 307, 175, 320, 311; 435/808, 356; 356/226; 250/205, 214 A, 214 AL, 214 AG

[56] References Cited

U.S. PATENT DOCUMENTS

| | | | |
|---|---|---|---|
| 3,421,005 | 1/1969 | Baker | 250/206 |
| 3,609,451 | 9/1971 | Edgerly, Jr. | 315/151 |
| 3,670,202 | 6/1972 | Paine et al. | 315/297 |
| 4,009,387 | 2/1977 | Nuver | 315/158 |
| 4,236,101 | 11/1980 | Luchaco | 315/307 |
| 4,281,365 | 7/1981 | Elving et al. | 315/158 |
| 4,463,284 | 7/1984 | Tamura et al. | 315/151 |
| 4,500,814 | 2/1985 | Blake | 315/323 |
| 4,533,854 | 8/1985 | Northrup | 315/158 |
| 4,587,459 | 5/1986 | Blake | 315/158 |
| 4,647,763 | 3/1987 | Blake | 315/158 |

OTHER PUBLICATIONS

National Electrical Code-Article #725-Class 2, Table 725-31(a) and Table 725-31(b).

*Primary Examiner*—David K. Moore
*Assistant Examiner*—Mark R. Powell
*Attorney, Agent, or Firm*—Bruce A. Kaser

[57] ABSTRACT

A self-contained light sensor head (10) has a photodiode (18) operable to produce an electrical response proportional to light intensity, and an amplifier (20) that produces an output signal from the photodiode's response. The head (10) further includes a gain control circuit, for suitably controlling the gain of the output signal, and has noise and oscillation control circuits. The latter circuits permit the sensor to generate a low voltage output signal that is compatible for input directly to an analog computer.

10 Claims, 3 Drawing Sheets

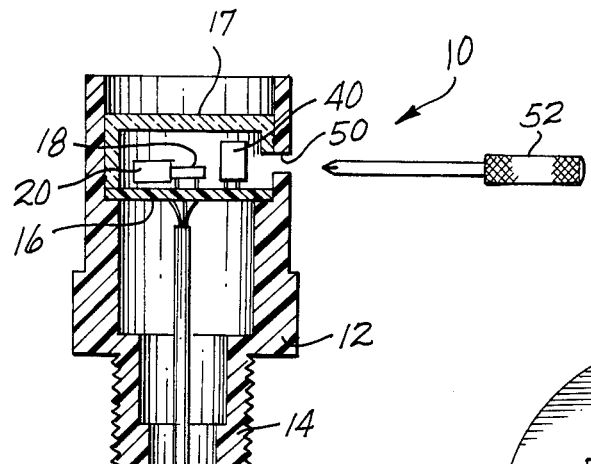
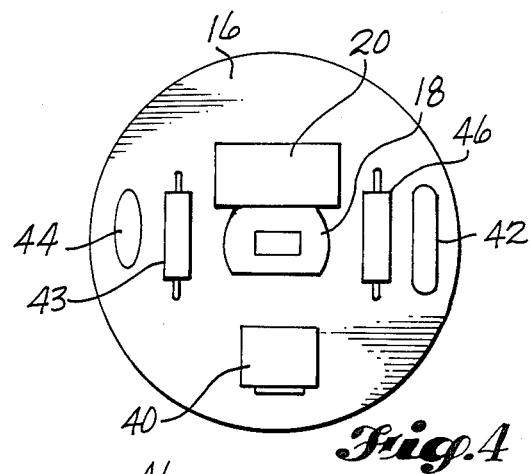
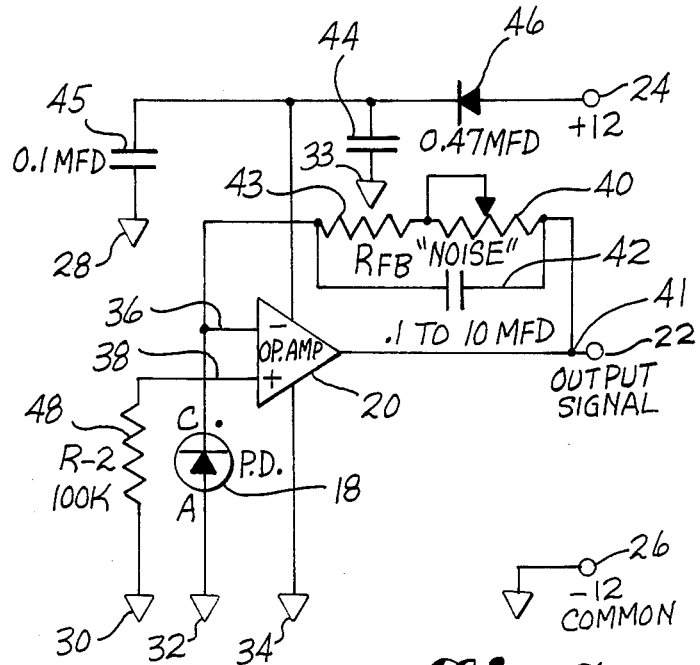

SELF-CONTAINED ANALOG PHOTODIODE LIGHT SENSING HEAD

TECHNICAL FIELD

This invention relates to light sensors, and in particular, to light sensors that are used to control artificial lighting in a given area in response to the amount of natural lighting available to the area.

BACKGROUND ART

The control of light artifically supplied to certain indoor and outdoor areas can involve a great deal of complexity. In this regard, it is not unusual for a light control system to employ a computer, especially when lighting is controlled in a number of areas at the same time. A good example of this kind of situation is light control in various offices and/or floors of a high-rise office building. The computer turns on, dims, or shuts off lights in specific work areas depending on the amount of natural lighting available in each. During a bright, sunny day lights may be turned off because sufficient natural light from the sun is available through windows or skylights. On the other hand, on a cloudy, dark day the computer would recognize the need for lights and would control them accordingly.

A separate light sensor is used to sense the amount of light in each regulated area. For example, in an office building there would be a number of regulated areas corresponding to the various offices located on different floors and on different sides of the building. Each sensor is connected to the system's computer which monitors the sensor's output. The kind of computer generally used in this application is an analog computer, which is typically designed to operate at certain low voltage and current levels. For example, a typical analog computer may be designed to receive signal inputs within the range of either 1 to 5 volts DC, or 4 to 20 milliamps. In the past, light sensors did not or could not output accurate signals compatible with these voltage and current level requirements.

It should be appreciated, and as a person skilled in the art would know, in a light control system it is important that sensor output accurately reflect the amount of light sensed. Sensors that use photodiodes, for example, output an electrical signal that corresponds to a voltage across the photodiode, which changes correspondingly with varying amounts of light received. This voltage and power output is low in magnitude. Since the sensor is usually physically located a significant distance from the computer, a photodiode's output cannot be directly transmitted to the computer over a wire without picking up significant electrical noise that impairs the signal. To overcome this, light control engineers have designed sensors that have an amplifier mounted in the sensor head. The amplifier outputs a signal at a higher voltage and/or current level that corresponds to the light measured by the photodiode. The higher voltage and/or current level makes the signal less susceptible to noise pickup and the signal can be transmitted relatively unimpaired. The trade-off is that although higher voltage or current is desirable for transmitting sensor output down a wire, it is by necessity too high to be compatible for direct input to the typical computer. Therefore, past practice has been to use additional gain control and conditioning circuitry that is remotely located from the sensor head but near the computer. This additional circuitry reduces and alters the sensor head's electrical output to compatible levels. This is the kind of system disclosed by me in U.S. Pat. No. 4,647,763 which issued on Mar. 3, 1987. Although it has its advantages from the standpoint that it permits conveniently accessible sensor head gain control at a single location for all sensors in a system, it has a significant disadvantage in that the requirement for remotely located gain control and conditioning circuitry adds significant expense to a light control system. I have solved this problem by developing a self-contained sensor head that has the unique capability of outputting a compatible signal directly to a computer.

DISCLOSURE OF THE INVENTION

The present invention is a light sensor head having self-contained therein certain electrical components that permit the head to output a low voltage or current signal that is directly transmittable to a computer. Mounted in the head is a conventional diode suitably positioned for sensing or receiving incoming light. The photodiode produces an electrical response that is proportional to light intensity. An operational amplifier, also mounted in the head, is operable to produce an output signal from the photodiode's electrical response. A gain control circuit controls the gain of this signal and is also mounted in the head, near the photodiode and amplifier. Normally, if the amplifier's output signal were to be transmitted over a wire of significant length this signal would be subject to noise and oscillation pickup, thus impairing its accuracy. The invention addresses this by additionally providing special noise and oscillation suppression circuits located in the head near the amplifier and gain control circuit. These latter circuits act to both slow the head's output response time and to suppress noise and oscillation pickup.

It should be appreciated that a sensor head constructed in accordance with this invention is designed for use in electrical systems that operate at relatively low voltage and current levels, and which qualify for class 2 wiring under the National Electrical Code No. 725. As a person skilled in the art would know, the wiring of such systems may be installed by a layperson, and may be routed where desired and surface-mounted without need of enclosing electrical conduit. Generally speaking, these systems may have circuit voltages as high as 30 volts with amperages no higher than 8 amps, although it is possible to stay within class 2 wiring at higher voltages if the amps are significantly reduced to very low levels. In this specification, it should be taken that the sensor head of the present invention operates within class 2 constraints, but at voltage and current levels that are generally far below the maximum limits defined by these constraints. Specifically, the sensor preferably outputs a signal in the range of 0 to 5 volts DC or 4 to 20 milliamps. As explained above, voltage and current levels within these smaller ranges are generally compatible for direct input to many analog computers.

An advantage to the present invention is that it outputs an extremely accurate signal that is computer compatible. Use of the invention in a light control system can significantly lower the cost of the system because it eliminates the need for separate circuit panels that previously were used to control and condition sensor output. Heretofore, separate panels were thought to be required because of the above-mentioned noise problem. The present invention has overcome this by providing effective noise control from the head itself, something not previously accomplished in the art.

An associated advantage to the above is that the sensor head can be constructed with only three electrical leads for connecting the head to the control system in which it is used. The sensor head requires a single power input lead, a commmon ground lead, and a single output lead for transmitting the output signal to the computer.

These advantages, and others, will become more apparent upon reading the following description in conjunction with the drawings.

BRIEF DESCRIPTION OF THE DRAWINGS

In the drawings, like reference numerals and letters refer to like parts throughout the various views, and wherein:

FIG. 3 is a side cross-sectional view of the sensor head shown in FIG. 1, and shows how gain control of the sensor head's output may be adjusted in the head;

FIG. 4 is a top-plan view of a component mounting board in the sensor head shown in FIGS. 1-3, and is taken along line 4—4 in FIG. 3;

FIG. 5 is a schematic of an electrical circuit that shows the construction and operational relationship of the various electrical components in the sensor head of FIGS. 1-4.

BEST MODE FOR CARRYING OUT THE INVENTION

Figures 1, 2:
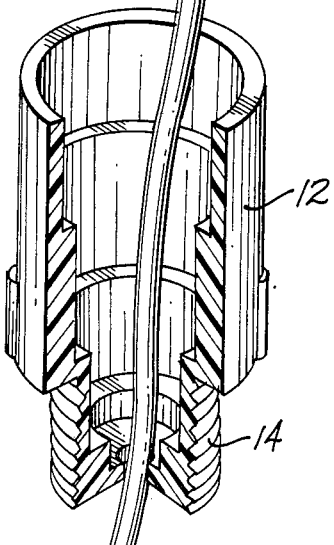
FIG. 1 is a pictorial view of a self-contained photodiode sensor head constructed in accordance with a preferred embodiment of the invention.
FIG. 2 is an exploded view in partial section of the sensor head shown in FIG. 1.

Referring now to the drawings, and first to FIGS. 1 and 2, therein is shown at 10 a sensor head constructed in accordance with a preferred embodiment of the invention. FIG. 2 shows an exploded view of the head 10. The head 10 has a housing 12 made of plastic or another suitable material. An end of the housing 12 may be threaded as indicated at 14 for connecting the head to another member. Received in the housing 12 is a circular circuit board 16 which is covered by a transparent lens 17. Mounted to the circuit board 16 is a conventional photodiode 18 and an operational amplifier 20. Also mounted to the board 16 are other electrical devices which provide gain control and which suppress noise and oscillation of the signal output from the head 10. These additional components will now be discussed by referring to FIG. 5.

The sensor head 10 requires only three leads indicated at 22, 24, 26, respectively, in FIG. 5. The first lead 22 transmits the head's output signal to an analog computer, which is not shown in the drawings. The second lead 24 is connected to a suitable 12-volt DC power source. The third lead 26 provides a common ground (12-volt DC negative) for the various electrical devices or components in the head 10. The various inverted triangles 28, 30, 32, 34 shown in FIG. 5 are conventional symbols that indicate connections to the common ground lead 26.

As would be apparent to a person skilled in the art, the amplifier 20 outputs a signal proportional to the electrical response of the photodiode 18. The photodiode's response is received by the amplifier 20 by means of a pair of inputs 36, 38, one being negative (−) and the other being positive (+) 38. Means for controlling gain of the amplifier's output signal is provided by a variable potentiometer 40 in series with a resistor 43 that couples the amplifier's negative input 36 to its output, indicated at 41. The potentiometer 40 has a variable resistance that permits variable adjustment or control of the gain. If desired, however, this resistance may be fixed, depending on the desired application of the sensor head 10.

A capacitor 42 connected in parallel to the gain control resistance 40 provides a means for suppressing noise in the output signal. Preferably, its capacitance is in the range of 0.1 to 10 microfarads. As a person skilled in the art would appreciate, this is a relatively high capacitance and will significantly slow the output response of the sensor head 10. In many cases, slow sensor response is a disadvantage and is undesirable. This is not so in light control systems, however. It is undesirable for a light control system to react quickly to sudden changes in sensed light because such changes may be only temporary. For example, it is conceivable the light in an office space might be affected by a sudden reflection from the window of a passing automobile. In this situation, it would be undesirable for the control system to flicker the office lights off and on in response to the passing car. Relatively slow sensor head response time eleminates this problem and thus constitutes an advantage.

More importantly, the large capacitance 42 effectively suppresses noise pickup of the output signal which is transmitted through lead 22. Usually noise is fairly high in frequency and short in duration. The capacitor evens these kinds of signals out so that they have little affect on the output signal.

Coupling the power input lead 24 to the common ground 26 is a second capacitor 44. The purpose of this capacitor is to suppress oscillation caused by natural electrical resonance. Resonance of this type is usually not addressed in the typical design of light sensors, although it can easily debilitate the quality of a sensor's output. This is especially true in the instant case where the sensor head 10 is designed to output a signal at very low voltage and current levels. Any line has a natural resonant frequency. The capacitor 44 eliminates the adverse effect such frequency has on the accuracy of the head's output signal. Another small-sized capacitor 45 is connected to the power lead 24 for further noise suppression. This capacitor is very fast and has a capacitance on the order of 0.1 microfarads.

A uni-directional diode 46 is positioned in the power lead 24 for preventing damage to the head's circuitry in case the head's leads are inadvertently connected in reverse. The diode head to be powered by a 12-volt AC signal. Another resistor 48 interconnects the positive input 38 of the operational amplifier 20 to the common ground 26. This resistor 48 is used in conjunction with an offset generator circuit which is discussed later. Preferably, it has a resistance value of 100 ohms.

Referring now to FIG. 3, therein is shown the means by which gain control can be adjusted in the head. The sensor housing 12 has a small port 50 which provides access to the potentiometer 40. Using a conventional jeweler's tool 52, the potentiometer's resistance may be altered while the sensor head 10 is mounted to another member.

Figure 6:
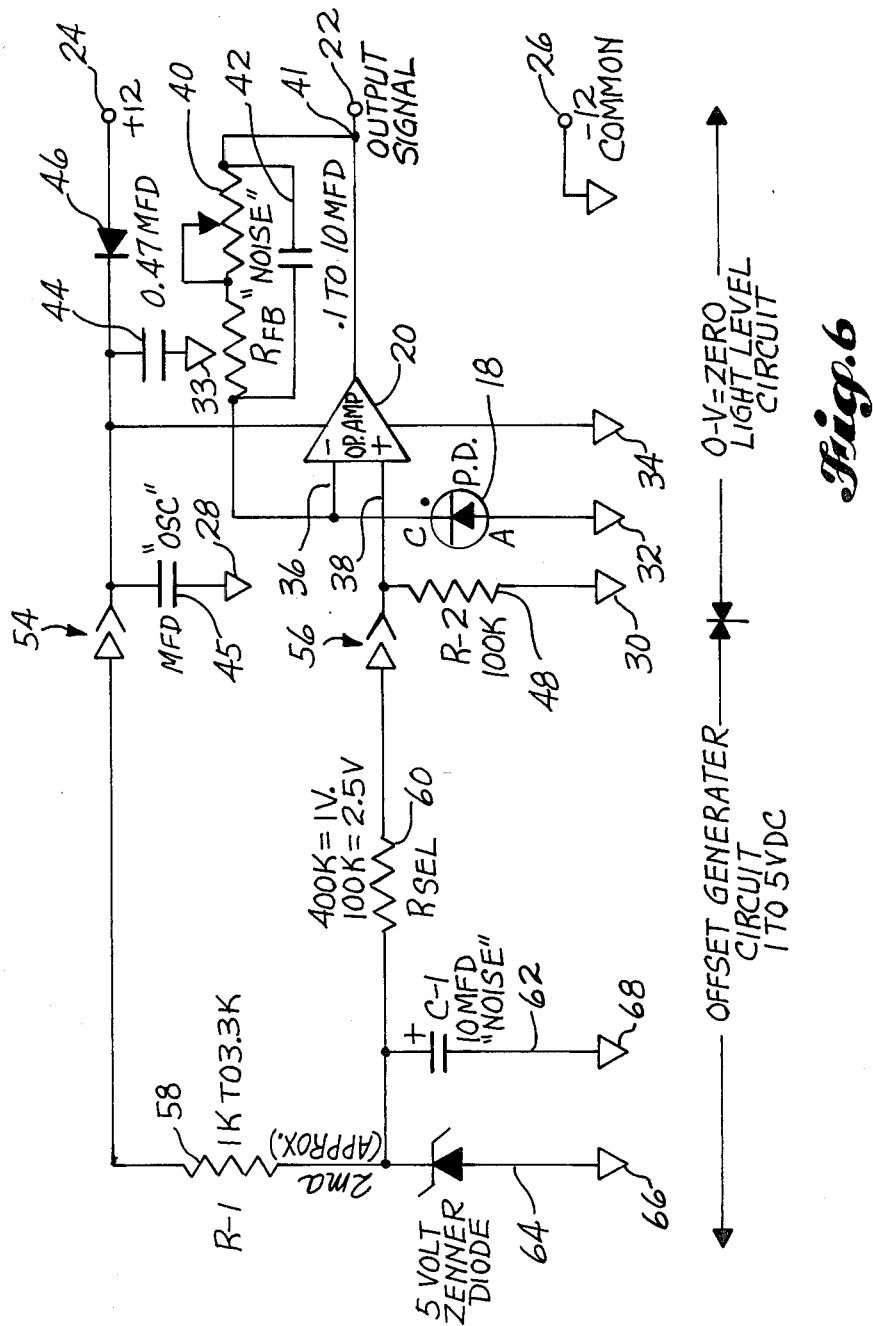
FIG. 6 is a schematic like FIG. 5, but shows a second embodiment wherein an offset generator circuit is added to the circuit of FIG. 5.

Referring now to FIG. 6, therein is shown a second embodiment of the invention wherein an offset generator circuit is added to the circuit shown in FIG. 5. By way of explanation, the circuit shown in FIG. 5 is preferred if it is desired to have the sensor head 10 output a signal in the range of 0 to 5 volts DC. Some analog computers, however, require signal inputs in the range of 1 to 5 volts DC. The purpose of the offset generator circuit, therefore, is to meet this latter requirement.

The offset generator circuit may be connected to the circuit of FIG. 5 at points 54 and 56, respectively. The offset circuit has two resistors 58, 60 whose values are designated in FIG. 5, a 10 microfarad capacitor 62 for suppressing noise in the circuit, and a 5-volt Zenner diode 64 which provides offset voltage. The operational connection of these devices is self-evident from FIG. 6. Both the Zenner diode 64 and the capacitor 62 are connected to the common ground lead 26 as shown at 66 and 68.

FIG. 4 shows a preferred arrangement for mounting the various above-discussed devices to the circuit board 16. All of the devices are mounted adjacent each other. However, in preferred form, the amplifier 20 is physically located as nearly adjacent the photodiode 18 as is possible, which reduces potential noise pickup in the leads interconnecting the amplifier 20 and photodiode 18.

It is to be appreciated the above description is not meant to limit the scope of patent protection, but is meant only to set forth the presently known best mode for carrying out the invention. The spirit and scope of the invention is to be limited only by the subjoined claims, wherein such claims are to be interpreted by using the legally established doctrines of patent claim interpretation.

What is claimed is:

1. A self-contained light sensor head operable to generate a low voltage and amperage output signal at a voltage no greater than thirty volts and an amperage no higher than eight amps, said signal being proportional to the amount of light sensed by said sensor head, and wherein the voltage and amperage of said output signal is compatible for direct transmission down a line from said sensor head to an analog computer that operates within a certain preselected range of voltages and amperages, said computer being remotely located from said sensor head, and said sensor head comprising:
   a sensor housing;
   a photodiode received in said housing and in a position for sensing light, said photodiode being operable to produce an electrical response representative of the intensity of said sensed light;
   means operable for amplifying said photodiode electrical response, and for producing said output signal therefrom, for transmission from said sensor head to said analog computer, said amplifying means being received in said housing and positioned adjacent said photodiode;
   means operable for controlling gain of said output signal produced by said amplifying means, wherein said gain control means is received in said housing and positioned adjacent said amplifying means and said photodiode;
   means operable for supression of electrical noise in said output signal by using an electrical capacitance greater than 0.1 microfarads, wherein said noise supression means is received in said housing and positioned adjacent said photodiode, said amplifying means, and said gain control means; and
   means operable for supression of resonant oscillations in said output signal, said oscillation supression means being received in said housing and positioned adjacent said photodiode, said amplifying means, said gain control means, and said noise supression means.

2. The sensor head of claim 1, wherein said gain control means provides adjustable gain control of said produced output signal.

3. The sensor head of claim 1, wherein said noise suppression means is connected electrically in a parallel with said gain control means.

4. The sensor head of claim 1, wherein said noise supression means includes means for slowing the response of said sensor head to rapid changes in light sensed by said photodiode.

5. The sensor head of claim 1, wherein said amplifying means includes an amplifier coupled by an electrically conductive line to a power source, and wherein said resonant oscillation suppression means includes means for providing a capacitance in coupled relationship between said line and an electrical ground.

6. A light sensor head having self-contained in said head certain electrical components operable to generate a low voltage and amperage output signal at a voltage no greater than thirty volts and an amperage no higher than eight amps, said signal being proportional to the amount of light sensed by said sensor head, and wherein the voltage and amperage of said output signal is compatible for direct transmission from said sensor head to an analog computer that operates within a certain preselected range of voltages and amperages, said head including three electrical leads, one of said leads being operable for transmitting said output signal to said computer, a second one of said leads being operable for receiving electrical operating power from a power source, and a third one of said leads being operable for providing a common electrical ground for at least some of said electrical components, said sensor head further including:
   a sensor housing;
   a photodiode received in said housing and in a position for sensing light, said photodiode being operable to produce an electrical response representative of the intensity of said sensed light;
   means operable for amplifying said photodiode electrical response, and for producing said output signal therefrom, for transmission of said signal through said output lead, from said sensor head to said analog computer, said amplifying means being received in said housing and positioned adjacent said photodiode;
   means operable for controlling gain of said output signal produced by said amplifying means, wherein said gain control means is received in said housing and positioned adjacent said amplifying means and said photodiode;
   means operable for supression of electrical noise in said output signal by using an electrical capacitance greater than 0.1 microfarads, wherein said noise supression means is received in said housing and positioned adjacent said photodiode, said amplifying means, and said gain control means; and
   means operable for supression of resonant oscillations in said output signal, said oscillation supression means being received in said housing and positioned adjacent said photodiode, said amplifying means, said gain control means, and said noise supression means.

7. The sensor head of claim 6, wherein said gain control means provides adjustable gain control of said produced output signal.

8. The sensor head of claim 6, wherein said noise suppression means is connected electrically in parallel with said gain control means.

9. The sensor head of claim 6, wherein said noise suppression means includes means for slowing the response of said sensor head to rapid changes in light sensed by said photodiode.

10. The sensor head of claim 6, wherein said amplifying means includes an amplifier coupled by an electrically conductive line to a power source, and wherein said resonant oscillation suppression means includes means for providing a capacitance in coupled relationship between said line and an electrical ground.

* * * * *